US008541795B2

(12) United States Patent
Keller et al.

(10) Patent No.: US 8,541,795 B2
(45) Date of Patent: Sep. 24, 2013

(54) SIDE-EMITTING OPTICAL COUPLING DEVICE

(75) Inventors: Bernd Keller, Santa Barbara, CA (US); Benjamin Jacobson, Chicago, IL (US); Robert Gengelbach, Rochester, NY (US)

(73) Assignee: Cree, Inc., Goleta, CA (US)

(*) Notice: Subject to any disclaimer, the term of this patent is extended or adjusted under 35 U.S.C. 154(b) by 0 days.

(21) Appl. No.: 11/247,563

(22) Filed: Oct. 10, 2005

(65) Prior Publication Data
US 2006/0076568 A1    Apr. 13, 2006

Related U.S. Application Data

(60) Provisional application No. 60/618,081, filed on Oct. 12, 2004.

(51) Int. Cl.
 *H01L 33/00*    (2010.01)
(52) U.S. Cl.
 USPC .. 257/98; 257/100; 257/E33.056; 362/311.02
(58) Field of Classification Search
 USPC ........ 257/98, 99, 100, E33.056; 362/311.02, 362/310, 327, 336, 337, 338, 339, 555, 800
 See application file for complete search history.

(56) References Cited

U.S. PATENT DOCUMENTS

| | | | |
|---|---|---|---|
| 4,918,497 A | 4/1990 | Edmond | 357/17 |
| 5,027,168 A | 6/1991 | Edmond | 357/17 |
| 5,897,201 A | 4/1999 | Simon | |
| 6,361,190 B1 | 3/2002 | McDermott | 362/310 |
| 6,598,998 B2 | 7/2003 | West et al. | 363/307 |
| 6,607,286 B2 | 8/2003 | West et al. | 362/255 |
| 6,646,813 B2 * | 11/2003 | Falicoff et al. | 359/641 |
| 6,674,096 B2 * | 1/2004 | Sommers | 257/98 |
| 6,679,621 B2 * | 1/2004 | West et al. | 362/327 |
| 7,006,306 B2 * | 2/2006 | Falicoff et al. | 359/800 |

(Continued)

FOREIGN PATENT DOCUMENTS

| | | |
|---|---|---|
| CN | 1586017 A | 2/2005 |
| EP | 1 255 132 A1 | 11/2002 |

(Continued)

OTHER PUBLICATIONS

Physics of Semiconductor Devices, 2$^{nd}$ Edition, S.M. Sze, Tunnel Devices, Chapter 9, pp. 513-536. 1981. A Wiley-Interscience Publication.

(Continued)

*Primary Examiner* — Eduardo A Rodela
(74) *Attorney, Agent, or Firm* — Koppel, Patrick, Heybl & Philpott

(57) ABSTRACT

An LED package includes a LED structure that outputs light in a pattern about an axis and an optical coupling device with a central axis. The coupling device is positioned relative to the LED structure and accepts light from the LED. The coupling device includes a first dielectric interface surface that is substantially cylindrical with respect to the central axis, and a reflecting surface. The first dielectric interface surface accepts a first portion of light from the LED structure and directs it toward the reflecting surface. The reflecting surface accepts the light from the first dielectric interface surface and directs it toward the first dielectric interface surface in a direction substantially perpendicular to the central axis.

34 Claims, 5 Drawing Sheets

(56) References Cited

U.S. PATENT DOCUMENTS

| | | | |
|---|---|---|---|
| 7,111,964 B2 | 9/2006 | Suehiro et al. | 362/328 |
| 7,118,262 B2 * | 10/2006 | Negley | 362/555 |
| 2002/0057056 A1 | 5/2002 | Okazaki | |
| 2003/0156416 A1 | 8/2003 | Stopa et al. | |
| 2005/0263785 A1 * | 12/2005 | Kim et al. | 257/100 |
| 2005/0276066 A1 | 12/2005 | Kim et al. | |
| 2006/0119250 A1 | 6/2006 | Suehiro et al. | |
| 2007/0121343 A1 | 5/2007 | Brown | |

FOREIGN PATENT DOCUMENTS

| | | |
|---|---|---|
| EP | 1255132 A1 | 11/2002 |
| JP | 05-183194 | 7/1993 |
| JP | 5183194 | 7/1993 |
| JP | 997927 | 4/1997 |
| JP | 2000299500 A | 10/2000 |
| JP | 2003008081 | 1/2003 |
| JP | 2004-140327 A | 5/2004 |
| JP | 2004140327 | 5/2004 |
| JP | 2004-281606 A | 10/2004 |
| JP | 2004281606 | 10/2004 |
| WO | WO 2008000244 A2 | 1/2008 |
| WO | WO 2008077338 A1 | 7/2008 |
| WO | WO 2008140884 A1 | 11/2008 |

OTHER PUBLICATIONS

Patent Publication No. US 2002/0057056 A1, May 16, 2002, Okazaki.
Patent Abstracts of Japan, vol. 017, No. 599, Nov. 2, 1993 Koichi.
Patents Abstracts of Japan, vol. 2000, No. 13, Feb. 5, 2001, Mayumi.
Patent Abstracts of Japan, vol. 1997, No. 08, Aug. 29, 1997, Toshiba Corp.
PCT Notification of Transmittal of International Preliminary Report on Patentability. Sep. 26, 2007.
PCT International Search Report and Written Opinion Feb. 2, 2006.
First Official Communication from the EPO pursuant to Article 94(3) EPC, Dated: Jul. 8, 2008, Europe application No. 05 802 983.6.
PCT International Search Report and Written Opinion From Related PCT Application No. PCT/US2009//001212, Dated: Jul. 3, 2009.
US Publication No. US 2007/0247856 A1, Date: Oct. 25, 2007 to Wang et al.
US Publication No. US 2007/0029563 A1, Date: Feb. 8, 2007, to Amano et al.
US Publication No. US 2006/0018010 A1, Date: Jan. 26, 2006, to Blumel.
US Publication No. US 2005/0094393 A1, Date: May 5, 2005, to Czajkowski.
Office Action from U.S. Appl. No. 12/074,762 mailed on Jul. 22, 2010.
Response to Office Action from U.S. Appl. No. 12/074,762 filed Nov. 22, 2010.
Office Action from U.S. Appl. No. 12/074,762, dated: Feb. 3, 2011.
Second Office Action from Chinese Patent Appl. No. 200980115965. 2, dated Jan. 21, 2013.
Office Action from Korean Patent Application No. 10-2007-7010841. dated: Dec. 19, 2011.
First Office Action from Chinese Application No. 200980115965.2, dated Apr. 6, 2012.
Examiner's First Report for counterpart Australian Patent Application No. 2005295913 dated Jun. 30, 2010.
International Preliminary Report on Patentability dated Aug. 6, 2007 for counterpart Application No. PCT/US05/36438.
Office Action from European Patent Application No. 09 716 428.9 dated Feb. 24, 2011.
International Preliminary Report on Patentability for PCT Application No. PCT/US09/01212 mailed Mar. 7, 2011.
Notice of Reasons for Rejection for counterpart Japanese Patent Application No. 2007-536779 dated May 19, 2011.
Decision of Rejection from Japanese Patent Application No. 2007-536779, dated Jul. 24, 2012.
Office Action for counterpart Taiwan Patent Application No. TW 094135548 dated Aug. 2, 2011.
Second Examination Report for European Patent Application No. EP 09716428.9 dated Oct. 7, 2011.
Office Action from U.S. Appl. No. 12/074,762, dated: Oct. 28, 2011.
Examination Report from European Patent Application No. 09716428.9-2423, dated Sep. 7, 2012.
European Search Report from European Patent Application No. 12164833.1-2423, dated Sep. 24, 2012.

* cited by examiner

SIDE-EMITTING OPTICAL COUPLING DEVICE

RELATED APPLICATION DATA

This application claims the benefit U.S. Provisional Application Ser. No. 60/618,081 filed Oct. 12, 2004.

BACKGROUND OF THE INVENTION

1. Field of the Invention

This invention relates to light emitting diode (LED) packages and more particularly to side-emitting LEDs.

2. Description of Related Art

As illustrated in FIG. 1, many light sources, including many light emitting diode (LED) semiconductor die, produce light in a Lambertian radiation pattern with respect to an axis perpendicular to the base plane of the die. The majority of the light leaving the die is substantially forwardly directed, although much of it is at a wide angle. Many applications, however, require substantially all light to be directed at a wide angle, approaching or somewhat exceeding 90°, with little or no light at forward angles.

In order to obtain a wide angle distribution of light from an LED package, a side-directing lens configured to redirect light may be added to the LED package. FIG. 2 illustrates a known LED package with such a lens. The LED package includes an LED chip, a lens with straight vertical sidewalls and a funnel-shaped top surface. There are two main paths in which light travels through the package. The first light path P1 is desirable. The light emitted from the chip travels to the top surface where total internal reflection (TIR) causes the light to exit through the sidewall at approximately 90° to the longitudinal axis. The second light path P2 is light emitted from the chip towards the sidewall at an angle that causes TIR or reflection from the sidewall toward the top surface at an angle that allows the light to exit through the top surface. This path is not desirable and limits the efficiency of side extracted light.

U.S. Pat. No. 6,607,286 discloses such another side-directing lens. The lens, which is shown in FIG. 3, includes a sawtooth, refractive portion and a top funnel portion. The sawtooth portion is intended to refract and bend light so that the light exits the lens close to 90° with respect to the longitudinal axis of the LED. The sawtooth feature of this lens, however, makes the lens difficult to manufacture. For example, during an injection molding process, the undercuts of the sawtooth feature necessitate a side action injection mold.

SUMMARY OF THE INVENTION

Briefly, and in general terms, the invention is directed to light emitting diode (LED) packages and lenses for directing and emitting light at the side of an LED or other light source. In one aspect, the invention relates to an LED package that includes an LED structure that outputs light in a pattern about an axis and an optical coupling device with a central axis. The coupling device is positioned relative to the LED structure and accepts light from the LED. The coupling device includes a first dielectric interface surface that is substantially cylindrical with respect to the central axis, and a reflecting surface. The first dielectric interface surface accepts a first portion of light from the LED structure and directs it toward the reflecting surface. The reflecting surface accepts the light from the first dielectric interface surface and directs it toward the first dielectric interface surface in a direction substantially perpendicular to the central axis.

In another aspect, the invention relates to a lens for use with a light emitting device that outputs light in a pattern about an axis. The lens includes a first dielectric interface surface that is substantially cylindrical with respect to a central axis and a reflecting surface that includes an inward-extending portion that extends into the cylinder defined by the first dielectric interface surface.

In yet another aspect, the invention relates to a method of directing light from a light emitting device. The method includes generating light output from the light emitting device in a pattern about an axis and redirecting the light output using an optical coupling device having a central axis and positioned relative to the LED structure to accept light from the LED. The device includes a first dielectric interface surface that is substantially cylindrical with respect to the central axis, and a reflecting surface. Redirecting light includes accepting a first portion of light from the LED structure at the first dielectric interface surface and directing it toward the reflecting surface and accepting the light from the first dielectric interface surface at the reflecting surface and directing it toward the first dielectric interface surface in a direction substantially perpendicular to the central axis.

These and other aspects and advantages of the invention will become apparent from the following detailed description and the accompanying drawings which illustrate by way of example the features of the invention.

DETAILED DESCRIPTION OF THE PREFERRED EMBODIMENTS

The present invention provides light emitting diode (LED) packages and lenses that cause the light emitted from a light source to be substantially sideways emitted from the package instead of forward emitted. Such an LED package includes an LED structure that outputs light in a pattern about an axis and an optical coupling device or lens with a central axis. The coupling device is positioned relative to the LED structure and accepts light from the LED. The coupling device includes a first dielectric interface surface that is substantially cylindrical with respect to the central axis, and a reflecting surface. The first dielectric interface surface accepts a first portion of light from the LED structure and directs it toward the reflecting surface. The reflecting surface accepts the light from the first dielectric interface surface and directs it back toward the first dielectric interface surface as opposed to allowing the light to pass through the reflecting surface. The light is directed toward the first dielectric interface surface in a direction substantially perpendicular to the central axis such that the light is emitted through the first dielectric interface surface. Accordingly, light that would otherwise be emitted in the forward direction is sideways emitted.

Figure 1:
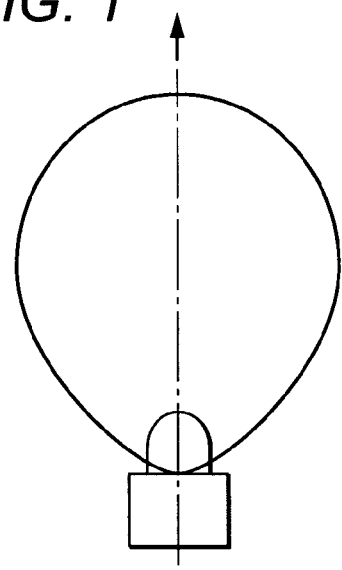
FIG. 1 is an illustration of the illumination pattern of a typical LED.
Figure 2:
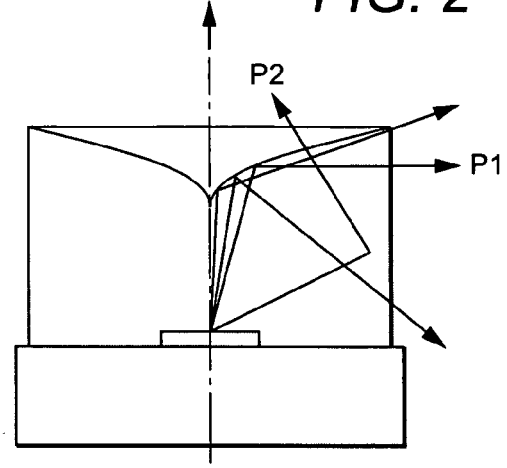
FIG. 2 depicts a known LED package.
Figure 3:
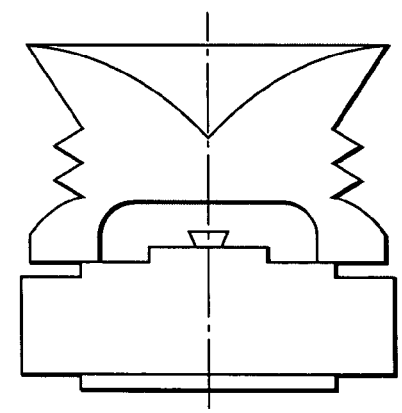
FIG. 3 depicts another known LED package.
Figure 4:
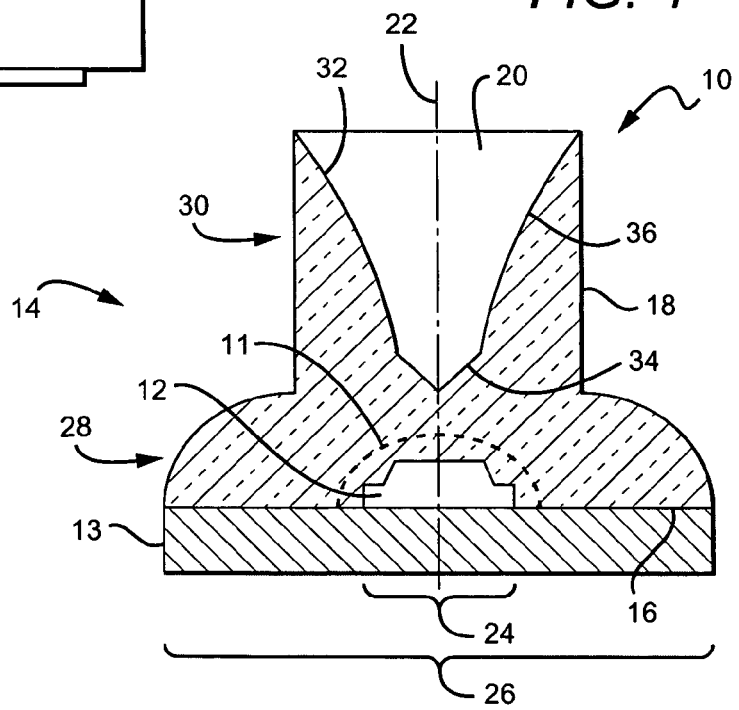
FIG. 4 is a sectional view of an LED package configured in accordance with the invention and including an LED structure and an optical coupling device or lens.
Figure 5:
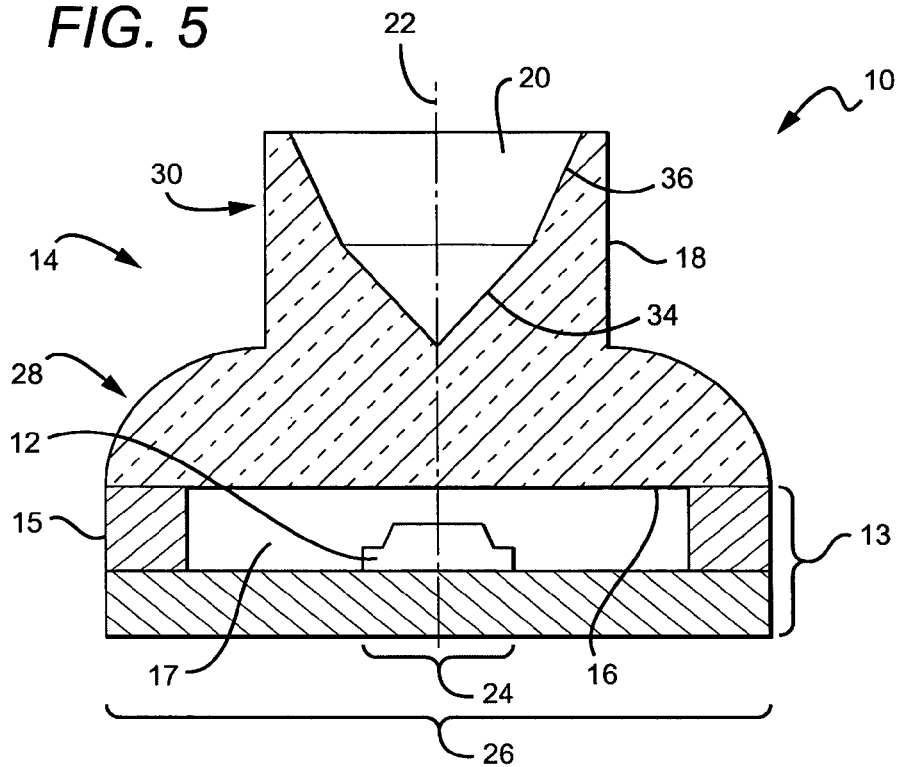
FIG. 5 is a sectional view of another LED package configured in accordance with the invention.

Referring now to the drawings and particularly to FIGS. 4 and 5, there are shown two exemplary configurations of side-emitting LED packages 10. Each package 10 includes an LED 12 on a base structure 13 and a body 14 positioned relative to the LED and the base structure such that light from the LED is introduced into the body.

In the configuration of FIG. 4, the LED 12 is located in the interior of the body 14 and light is emitted in the body at its interior. This configuration may be made by forming the body 14 directly over the LED 12 and on the surface of the base structure 13 by, for example, injection molding. In an alternate version of this configuration, an encapsulating material 11 is formed over the LED 12 to protect the LED during the body formation process.

In the configuration of FIG. 5, the LED 12 is located beneath the lower surface 16 of the body 14 and light enters the body through the lower surface. In this configuration, the body 14 is manufactured as a separate component using a number of well-known techniques such as diamond turning (i.e., the lens is shaped by a lathe with a diamond-bit), injection molding, and casting. The body 14 is adhesively secured to the base structure 13, which includes a perimeter support 15 that surrounds the LED 12. Prior to securing the body 14, the volume 17 between the LED 12 and the perimeter support 15 may be filled with an optically transparent material, including but not limited to resin, silicone, epoxy, or any material with an index of refraction within the same range as the material forming the body. Alternatively, the volume 17 may be filled with a medium having an index of refraction different from the body, such as air.

The body 14 can be made of many different materials capable of transmitting light, but is preferably made of a transparent material, including but not limited to glass, silicone, acrylic, cyclic olefin copolymer (COC), polymethylmethacrylate (PMMA), polycarbonate (PC), PC/PMMA, and polyetherimide (PEI). The body 14 has an index of refraction (n) ranging from between 1.4 and 1.6 and is preferable about 1.5.

Figure 6:
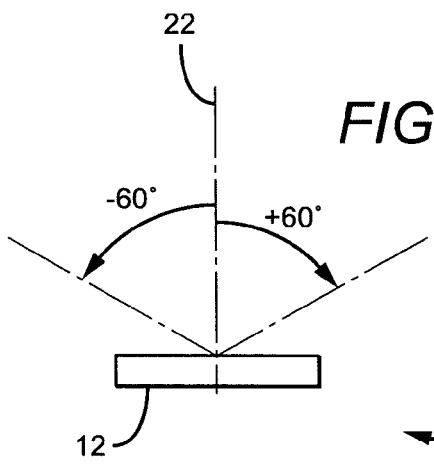
FIG. 6 is a graphical depiction of the angular distribution of light relative to an axis perpendicular to the LED emission axis.

With continued reference to FIGS. 4 and 5, the transparent body 14 has a lower surface 16, a side surface 18, and a top surface 20. The body 14 accepts light from the LED 12 having a wide angular distribution relative to a central axis 22 or central plane of the body. With reference to FIG. 6, "wide angular distribution" as used herein typically means angles up to and exceeding +60° and −60°, relative to the central axis, as indicated by the shaded area. Returning to FIGS. 4 and 5, in general the light is emitted from a region having an extent 24, in the direction perpendicular to the central axis or plane, significantly smaller than the extent 26 of the body itself.

Figure 11:
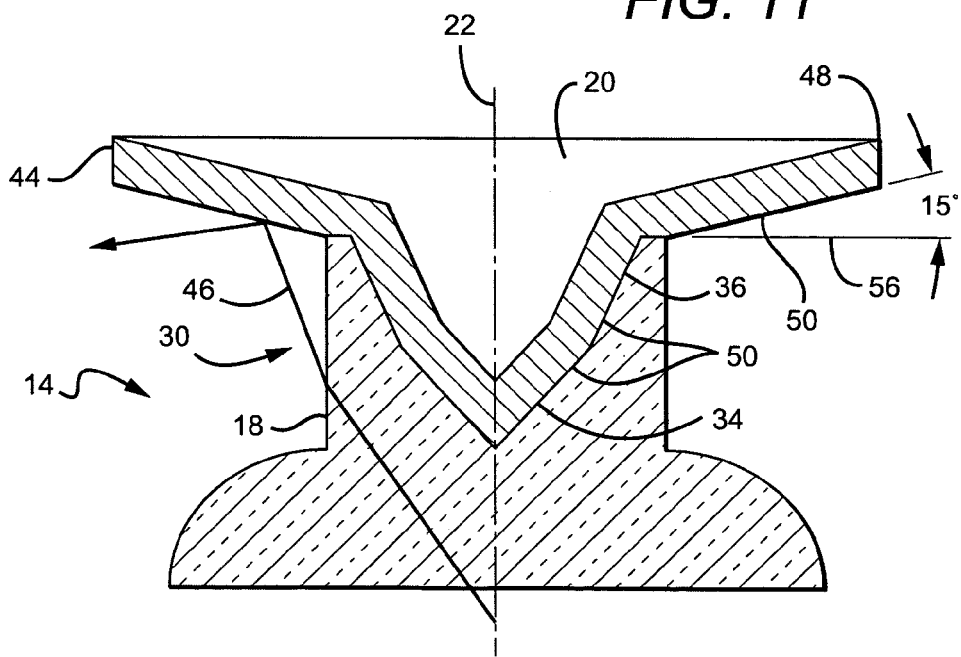
FIG. 11 is a combination sectional view of an alternate embodiment of a lens and schematic representation of the optical properties of the lens.
Figure 12:
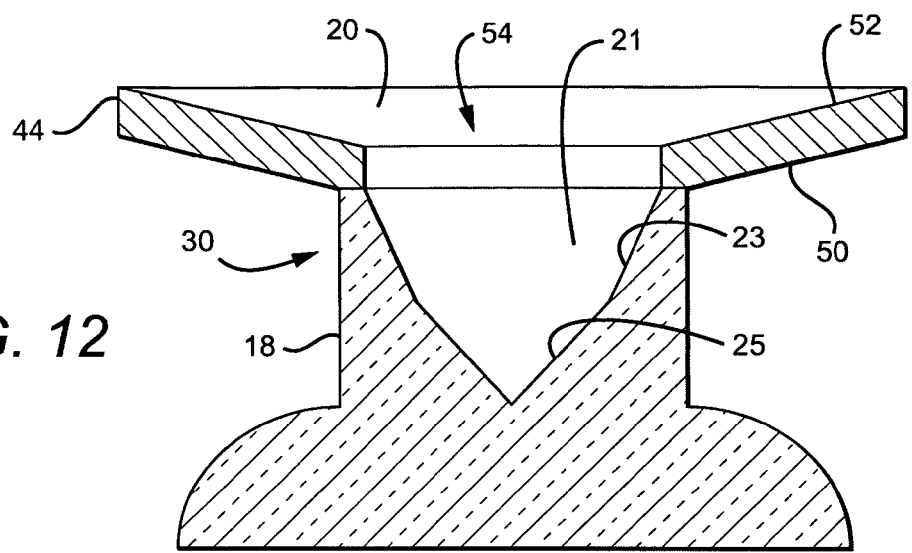
FIG. 12 is a sectional view of an alternate configuration of the lens of FIG. 11.

The side surface 18 is a dielectric interface (for example, with air) permitting transmission of light having appropriate angles. The side surface 18 has a lower portion 28 and an upper portion 30. The top surface 20 is made reflective, for example, by coating the inner cone surface 32 of the body 14 with a metallic reflector layer, or by adding a second body (as shown in FIGS. 11 and 12) having a metallic reflective layer that faces the body. This top surface 20 has an inner portion 34 and an outer portion 36. In a preferred embodiment, both the side surface 18 and the top surface 20 are in the form of surfaces of revolution about the central axis 22, and the upper portion 30 of the side surface 18 is roughly parallel to this central axis.

Figure 7:
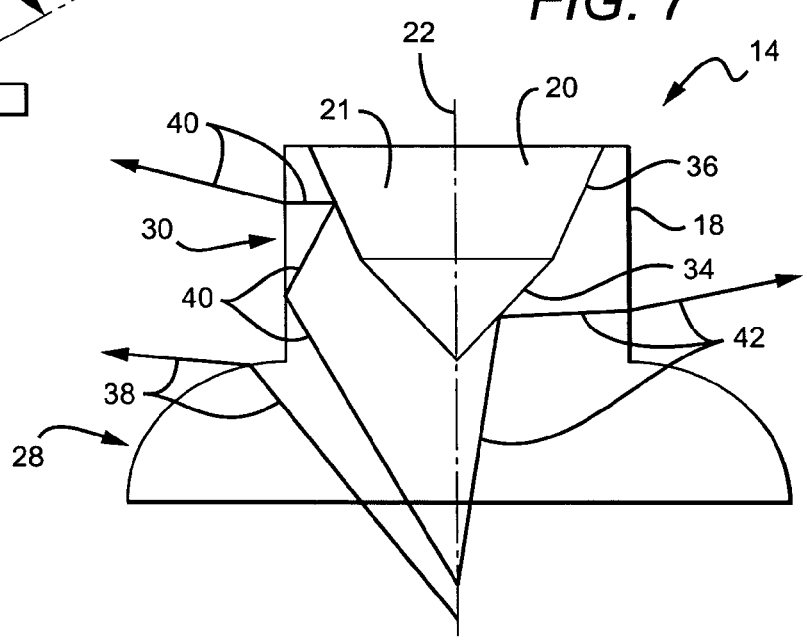
FIG. 7 is a schematic representation of the optical properties of the lens of FIG. 5.
Figure 8:
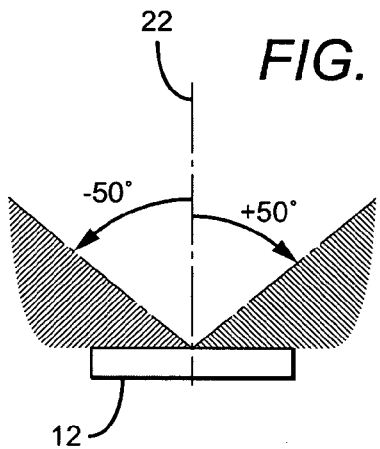
FIGS. 8, 9 and 10 are graphical depictions of various portions of light distribution relative to an axis perpendicular to the LED emission axis.

With reference to FIG. 7 and regarding the optical properties of the LED package 10 in FIGS. 4 and 5, the body 14 is shown. A wide-angle fraction of the light 38 is redirected by refraction at the lower portion 28 of the side surface 18, to exit the body 14 roughly perpendicular to the central axis 22. With reference to FIG. 8, a "wide-angle" as used herein means angles beyond approximately ±50° relative the central axis 22, as indicated by the shaded area.

Figure 9:
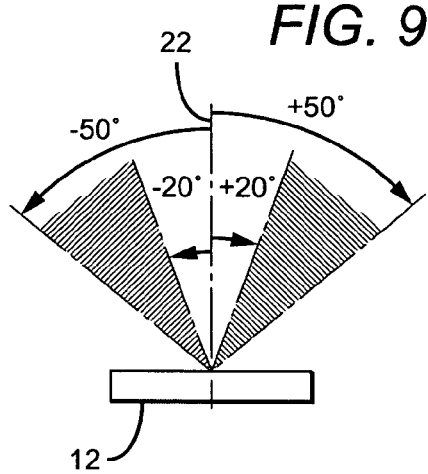

Returning to FIG. 7, a narrower-angle fraction of the light 40 is incident on the upper portion 30 of the side surface 18. With reference to FIG. 9, a "narrow-angle" as used herein means angles within roughly ±50° but beyond roughly ±20° relative the central axis 22 as indicated by the shaded region. Because the upper portion 30 of the side surface 18 is parallel to the central axis 22, this light impinges on the side surface with incident angles approaching or exceeding the critical angle, and the majority or even substantially all of the light is reflected at the side surface.

Returning to FIG. 7, the redirected light 40 then impinges on the outer portion 36 of the top surface 20, where it is reflected back toward the upper portion 30 of the side surface 18, with an associated change in angle. The change in angle is such as to cause the redirected rays 40 to make a much smaller incident angle with the side surface 18 and therefore to be transmitted through the upper portion 30 of the side surface. In a preferred embodiment, a majority of the reflected rays 40 are nearly perpendicular to the upper portion 30 of the side surface 18, and therefore the light exits the body 14 approximately normal, i.e., to the side surface. "Nearly perpendicular" within this context means incident angles of less than about 20° relative to the surface of the upper portion 30. "Approximately normal" means exit angles of less than about 30° relative to the surface of the upper portion 30.

Figure 10:
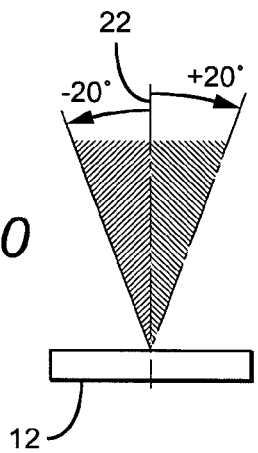

With continued reference to FIG. 7, a narrowest-angle fraction of light 42 impinges on the inner portion 34 of the top surface 20 without first being reflected at the side surface 18. As illustrated in FIG. 10, a "narrowest-angle" as used herein means angles within roughly ±20° of the central axis 22, as indicated by the shaded area. This fraction of light 42 is also redirected by reflection toward the upper portion 30 of the side surface 18 at angles approximately normal to the upper portion 30 of the side surface, and therefore this fraction of light also exits the body 14 approximately normal to the central axis 22.

A smaller amount of light is also emitted from the body 14 in directions other than the main ray paths 38, 40, 42 listed above. For example, Fresnel reflections, haze in the material, and surface roughness are known to cause stray light, some of which will be emitted from the body 14 in unwanted high angles. Within this context, "high angles" means angles outside ±30° of the surface of the upper portion 30. There can also be a minority of ray paths that impinge on the upper portion 30 of the side surface 18 with incidence angles less than the critical angle, so that they are not fully reflected, but are partially transmitted at high angles. A minority of ray paths can also be refracted into relatively high angles by parts of the lower portion 28 of the side surface 18.

With reference to FIG. 11, in another embodiment of the invention, optical performance can be further be improved by redirecting some of the unwanted high-angle rays 46, through the addition of a reflective third section 44 to the top surface 20 of the body 14. The third section 44 extends outward with respect to the upper portion 30 of the side surface 18 so that it can redirect light into desired side-emitting angles. The third section 44 can be angled relatively perpendicular to the central axis 22 to increase the fraction of light so redirected. In a further embodiment, a third section 44 positioned such that it is angled from between 10° to 30° relative to a line 56 perpendicular to the central axis has been found to further increase the amount of light perpendicular to the central axis 22, while increasing the total height of the device by an acceptable amount.

In the embodiment shown in FIG. 11, the third section 44 is part of a cup 48 that includes the inner and outer portions 34, 36 of the reflecting surface 20. The cup 48 is configured to fit in a bore 21 (shown in FIG. 7) formed in the upper portion of the body 14. The cup 48 may be made of any suitable material, such as plastic or metal, and may be formed using any one of several known techniques, such as stamping or machining. The bottom surfaces 50 of the funneled cup is reflective either through the formation of the cup using a reflective material or by coating or plating the surfaces with a reflective material. The funnel cup 48 may be secured to the body 14 using an adhesive, such as a silicone adhesive, that is compatible with the body 14 material.

With reference to FIG. 12, in another embodiment, the third section 44 may be formed as a tapered ring 52 instead of part of a cup. In this case, the opening 54 of the ring 52 is sized to substantially coincide with the inner diameter of the bore 21 in the top portion 30. In this case the lower surface 50 and the surfaces 23, 25 of the bore 21 form the top, reflecting surface 20. As with the embodiment of FIG. 8, the ring 52 may be secured to the body 14 using an adhesive, such as a silicone adhesive, that is compatible with the body 14 material. In another embodiment, all portions of the reflecting surface are formed as part of a unitary body 14, through a molding or machining process. It is understood that many other sections or devices can be added to direct light emission beyond those described herein.

Figure 13:
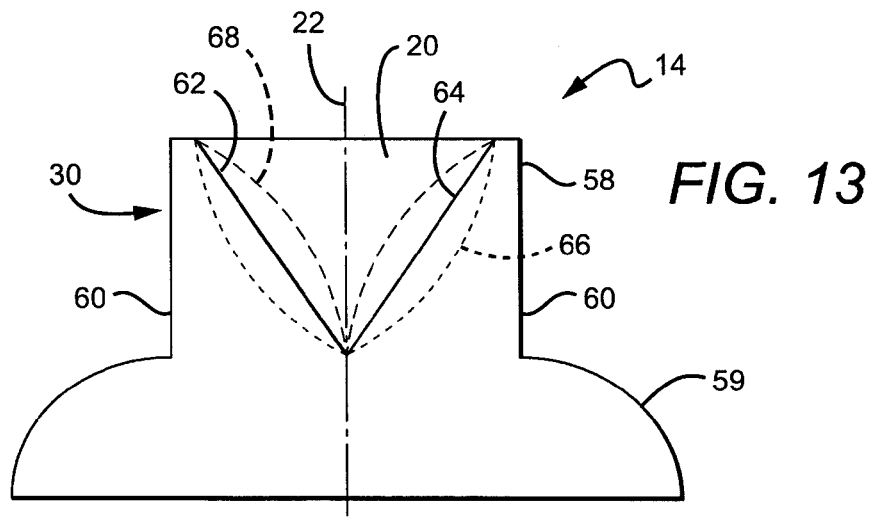
FIG. 13 is a general schematic of a lens configured in accordance with the invention.

While the preceding description has focused on the optical properties produced by the arrangement of the various surfaces of the body 14 of FIGS. 7 and 11, the body may be configured to have other surfaces arrangements and characteristics. As illustrated in FIG. 13, in general terms, the body 14 has a first dielectric interface surface 58 that is cylindrical about the central axis 22 of the body and a second dielectric interface surface 59 beneath the first dielectric interface surface that extends outward beyond the first dielectric interface surface. "Cylindrical" in this context means that the outer lines 60 produced by slicing the upper portion 30 through the central axis are substantially parallel with the central axis. Cylindrical does not necessarily mean that the cylinder defined by the first dielectric interface surface 58 is circular in cross section. The second dielectric interface surface 59 is generally convex, meaning a surface having a curved form which bulges outward, resembling the exterior of a curved body, e.g., sphere or cylinder, or a section of these bodies.

With reference to FIG. 12, in another embodiment, the third section 44 may be formed as a tapered ring 52 instead of part of a cup. In this case, the opening 54 of the ring 52 is sized to substantially coincide with the inner diameter of the bore 21 in the top portion 30. In this case the lower surface 50 and the surfaces 23, 25 of the bore 21 form the top, reflecting surface 20. As with the embodiment of FIG. 11, the ring 52 may be secured to the body 14 using an adhesive, such as a silicone adhesive, that is compatible with the body 14 material. In another embodiment, all portions of the reflecting surface are formed as part of a unitary body 14, through a molding or machining process. It is understood that many other sections or devices can be added to direct light emission beyond those described herein.

Alternatively, the reflecting surface 20 may be formed of multiple surfaces 34, 36 (FIGS. 4 and 5), which may be linear, concave, convex or any combination of the three, e.g., linear/linear, linear/concave, linear/convex, concave/linear, concave/convex, convex/linear or convex/concave. The relative sizes of the surfaces along the central axis may range between substantially the same (FIG. 5) to very different (FIG. 4). The angles of the surface 62 or surfaces 34, 36, relative to the central axis 22 may also vary. The ultimate characteristics of these various features of the body 14 depends on various factors, including constraints on the size of the body, the structure of the LED and its emission angle range, the intended positioning of the LED with respect to the body, the indices of refraction of the various mediums through which the light will travel, including the index of the body and any other mediums, e.g., epoxy, resin, air, etc., between the LED and body. Given these various factors, one of ordinary skill in the art of optics may tailor the features of the body to obtain the desired optical performance.

Figure 14:
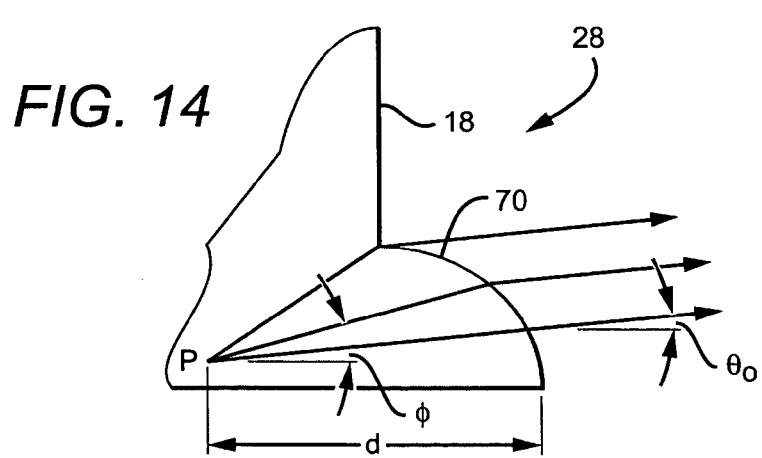
FIGS. 14 and 15 are schematics of a portion of a lens configured in accordance with the invention.

With reference to FIG. 14, in one embodiment, at least one region 70 of the lower portion 28 of the side surface 18 is shaped so that substantially all the rays emanating from a selected point P toward that region are refracted into an angle $\theta_0$ relative to the horizontal axis. The cross-sectional shape of the region 70 may be given in polar coordinates by the equation:

$$\rho(\phi) = \frac{d}{\cos\theta_0'} \frac{1 - \cos(\theta_0' - \theta_0)/n}{1 - \cos(\phi - \theta_0)/n}$$

where d is the distance from the selected point to the outer edge of the region in the horizontal direction, $$\theta_0' = \arcsin\left(\frac{\sin\theta_0}{n}\right),$$

and n is the refractive index of the dielectric medium. In a preferred embodiment, the selected point P is in the neighborhood of the center of the light source and 2d=the total diameter of the body.

Figure 15:
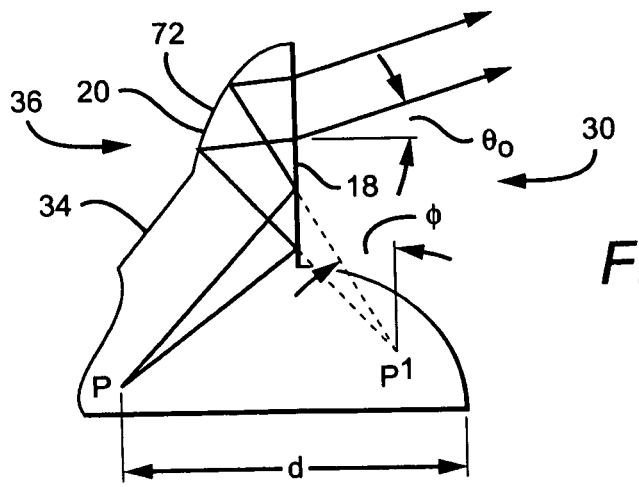

With reference to FIG. 15, in one embodiment, at least one region 72 of the outer portion 36 of the top surface 20 is shaped so that rays emanating from a selected point P and reflecting off the upper portion 30 of the side surface 18 are redirected to be emitted at an angle $\theta_0$ relative to the horizontal axis. Note that the upper portion 30 of the side surface 18 forms a virtual image P' of the point P. The cross-sectional shape of the region 72 of the outer portion 36 of the top surface 20 can then be a parabola that has an axis at the angle $\theta_0$ and a focus at P'. The shape of the region 72 may be described in polar coordinates centered on P', the shape having the equation:

$$\rho(\phi) = \frac{l}{1 + \cos(\phi + \theta_0')}$$

where l is a length parameter chosen to ensure that the region 72 intersects the upper portion 30 of the side surface 18 at the desired height. In a preferred embodiment, the selected point P is in the neighborhood of the center of the light source. In a preferred embodiment, the inner portion 34 of the top surface 20 makes an approximately 45 degree angle with the central axis of the body.

Figure 16:
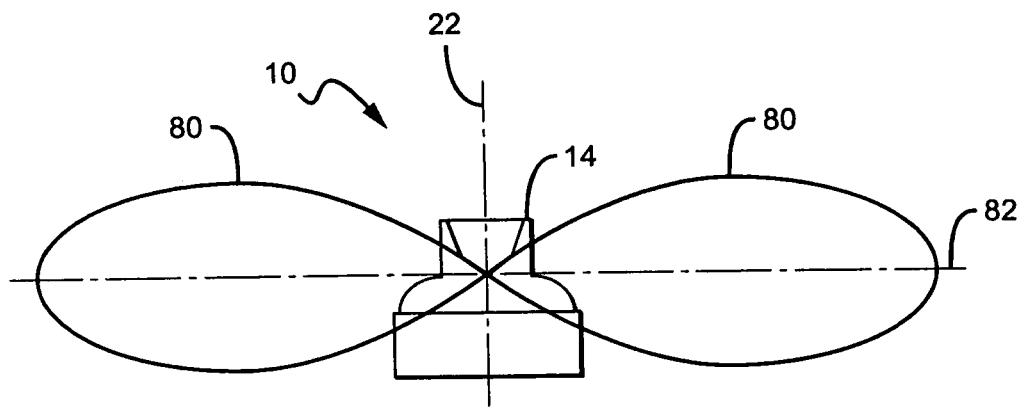
FIG. 16 is an illustration of the side emission of light from the LED package of FIG. 5.

FIG. 16 illustrates a cross-section of the emission of light from the LED package 10 of FIG. 5. The body 14 of LED package 10 creates a radiation pattern 80 or field of illumination that surrounds the LED package 10 and is roughly disk- or toroidal-shaped. The majority of the light emitted from the LED is between 70-110 degrees with respect to the normal axis 22 of the lens.

Figure 17:
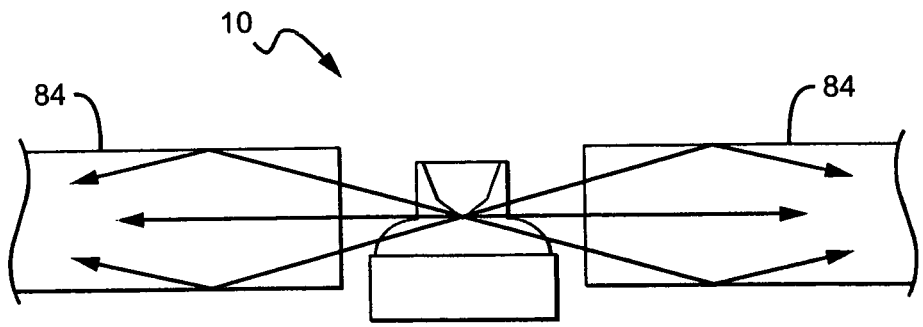
FIG. 17 is a sectional view of the side emission of light from the LED package of FIG. 5 into light guides.

As illustrated in FIG. 17, the side-emission of light allows even a single LED package 10 to illuminate multiple light guides 84. The side-emission of light from the LED package 10 allows light to enter each light guide 84. The LED package 10 may also be inserted into the body of light guide 84. Light guides of various shapes may be used. The sides along the length of the light guides may be planar or taper. For example, a single side emitting LED package 10 may be placed at the center of a disk-shaped light guide (not shown). As light is emitted from the side of LED package 10 in 360 degrees, i.e., in a full circle of directions from the center of LED package 10, said circle substantially coplanar with said disk-shaped light guide, the light enters the light guide and is refracted and reflected throughout the entire light guide (not shown). Other applications for the LED package include LED backlights for LCD Displays, TVs, traffic signals, aviation obstruction lights, LED lamps, lamps in parabolic reflectors and alarm signaling.

It will be apparent from the foregoing that while particular forms of the invention have been illustrated and described, various modifications can be made without departing from the spirit and scope of the invention. Accordingly, it is not intended that the invention be limited, except as by the appended claims.

We claim:

1. A light emitting diode (LED) package comprising:
    an LED structure outputting light in a pattern about an axis; and
    an optical coupling device having a central axis and positioned relative to the LED structure to accept light from the LED, the device comprising a homogenous first dielectric interface surface that is substantially cylindrical with respect to the central axis, and a multi-faceted reflecting surface comprising a plurality of faces, each of the faces arranged to reflect light in a direction substantially perpendicular to the central axis, the first dielectric interface surface accepting a first portion of substantially unrefracted light from the LED structure and directing it toward the reflecting surface, the reflecting surface accepting the light from the first dielectric interface surface and directing it toward the first dielectric interface surface to exit the device in a direction substantially perpendicular to the central axis;
    wherein said reflecting surface extends to cover the entire surface of revolution about the central axis;
    wherein a first face is obliquely angled with respect to the central axis from a side closest to the LED structure that accepts the first portion of light from the first dielectric interface surface;
    wherein a second face is obliquely angled with respect to the central axis from a side closest to the LED structure that accepts another portion of light from the LED structure and directs it toward the first dielectric interface surface in a direction substantially perpendicular to the central axis, wherein at least one of said first and second faces is straight; and
    wherein a third face of the reflecting surface extends outward and beyond the first dielectric interface surface.

2. The LED package of claim 1 wherein the optical coupling device further comprises a second dielectric interface surface accepting a second portion of light from the LED structure and refracting it from the device in a direction substantially perpendicular to the central axis.

3. The LED package of claim 2 wherein the second dielectric interface surface is convex.

4. The LED package of claim 1 wherein the reflecting surface extends into the cylinder defined by the first dielectric interface surface.

5. The LED package of claim 1 wherein a plurality of the faces of the reflecting surface are concave.

6. The LED package of claim 1 wherein the first face of the reflecting surface is substantially linear.

7. The LED package of claim 1 wherein the second face of the reflecting surface is substantially linear.

8. The LED package of claim 1 wherein the first face of the reflecting surface is convex.

9. The LED package of claim 1 wherein the second face of the reflecting surface is convex.

10. The LED package of claim 1 wherein the second face is obliquely angled with respect to the central axis at an angle different than the first face.

11. The LED package of claim 1 wherein said third face accepts a portion of light refracted by the first dielectric interface surface and directs it away from the central axis and in a direction substantially perpendicular to the central axis.

12. The LED package of claim 11 wherein the third face of the reflecting surface is substantially linear.

13. The LED package of claim 11 wherein the third face is obliquely angled with respect to the central axis from a side closest to the LED structure at an angle different than either of the first face or the second face of the reflecting surface.

14. The LED package of claim 11 wherein the third face is substantially perpendicular with respect to the central axis of the reflecting surface.

15. The LED package of claim 11 wherein the third face of the reflecting surface is concave.

16. The LED package of claim 1 wherein the LED structure includes a base structure and an LED on the base structure, and the optical coupling device is positioned over the LED and the base structure.

17. The LED package of claim 16 wherein the optical coupling device is in direct contact with the LED.

18. The LED package of claim 16 wherein a volume exists between the LED and the optical coupling device.

19. The LED package of claim 18 wherein the volume is filled with a material having an index of refraction substantially the same as the optical coupling device.

20. The LED package of claim 18 wherein the volume is filled with air.

21. A lens for use with a light emitting device that outputs light in a pattern about an axis, said lens comprising:
- a first dielectric interface surface that is substantially cylindrical with respect to a central axis; and
- a reflecting surface comprising an inward-extending portion that extends into the cylinder defined by the first dielectric interface surface, wherein said reflecting surface extends to cover the entire surface of revolution about the central axis, wherein the first dielectric interface surface directs light toward the reflecting surface;
- wherein the reflecting surface contains at least first and second faces, each of said faces arranged to reflect light toward the first dielectric interface surface, that are obliquely angled with respect to the central axis; and
- wherein the reflecting surface comprises a third concave face arranged to reflect light away from the first dielectric interface surface, and an outward-extending portion coupled to said inward-extending portion to form a continuous reflective body, wherein said outward-extending portion extends outward with respect to the first dielectric interface surface.

22. The lens of claim 21 further comprising a second dielectric interface surface beneath the first dielectric interface surface that extends outward from the first dielectric interface surface.

23. The lens of claim 22 wherein the second dielectric interface surface is convex.

24. The lens of claim 21 wherein the inward-extending portion of the reflecting surface is formed as part of a structure that includes the first dielectric interface surface.

25. The lens of claim 21 wherein the inward-extending portion of the reflecting surface is affixed to a structure that includes the first dielectric interface surface.

26. The lens of claim 21 wherein the outward-extending portion of the reflecting surface is affixed to the inward-extending portion of the reflecting surface.

27. The lens of claim 21 wherein the inward-extending and outward-extending portions of the reflecting surface are affixed to a structure that includes the first dielectric interface surface.

28. The lens of claim 27 wherein the reflecting surface comprises a cup structure comprising a reflective lower surface.

29. The lens of claim 21 wherein the inward-extending and outward-extending portions of the reflecting surface and a structure that includes the first dielectric interface surface comprise one piece.

30. The lens of claim 21 wherein said outward-extending portion extends past the remaining structure.

31. A lens for use with a light emitting device that outputs light in a pattern about an axis, said lens comprising:
- a first dielectric interface surface that is substantially cylindrical with respect to a central axis; and
- a reflecting surface comprising an inward-extending portion that extends into and is received by a recess of the cylinder defined by the first dielectric interface surface, wherein said inward-extending portion contains at least first and second faces that are obliquely angled with respect to the central axis, each of said faces arranged to reflect light toward the first dielectric interface surface;
- wherein the reflecting surface further comprises an outward-extending portion that extends outward with respect to the first dielectric interface surface;
- wherein the outward-extending portion extends past the remaining structure;
- wherein the outward-extending portion of the reflecting surface is formed separate from the inward-extending portion of the reflecting surface and configured to expose said recess;
- wherein the outward-extending portion is a ring structure comprising a reflective lower surface.

32. The lens of claim 31, wherein said ring structure is placed over said inward-extending portion.

33. A method of directing light from a light emitting device, said method comprising:
- generating light output from the light emitting device in a pattern about an axis; and
- redirecting the light output using an optical coupling device having a central axis and positioned relative to the LED structure to accept light from the LED, the device comprising a homogenous first dielectric interface surface that is substantially cylindrical with respect to the central axis, and a reflecting surface comprising at least first, second and third faces configured to form a continuous reflective body, each of the first and second faces arranged to reflect light toward said first dielectric interface surface in a direction substantially perpendicular to the central axis, wherein the third face extends outward with respect to said first dielectric interface surface and is arranged to reflect light away from said first dielectric interface surface in a direction substantially perpendicular to the central axis, said first and second faces are obliquely angled with respect to the central axis from a side closest to the LED, at least one of said faces is linear, and said third face is concave, wherein redirecting light comprises:
- accepting a first portion of substantially unrefracted light from the LED structure at the first dielectric interface surface and directing it toward the reflecting surface;
- accepting the light from the first dielectric interface surface at the reflecting surface and directing it toward the first dielectric interface surface in a direction substantially perpendicular to the central axis; and
- accepting a second portion light directly from the LED structure at the reflecting surface and directing it toward the first dielectric interface surface in a direction substantially perpendicular to the central axis.

34. The method of claim 33 wherein the method further comprises:
- accepting a portion of light redirected by either the first dielectric interface surface or the reflecting surface; and
- directing it away from the central axis and in a direction substantially perpendicular to the central axis.

* * * * *